(12) United States Patent
Lugauer et al.

(10) Patent No.: US 8,420,439 B2
(45) Date of Patent: Apr. 16, 2013

(54) METHOD OF PRODUCING A RADIATION-EMITTING THIN FILM COMPONENT AND RADIATION-EMITTING THIN FILM COMPONENT

(75) Inventors: Hans-Jürgen Lugauer, Sinzing (DE); Klaus Streubel, Laaber (DE); Martin Strassburg, Tegernheim (DE); Reiner Windisch, Pettendorf (DE); Karl Engl, Pentling (DE)

(73) Assignee: OSRAM Opto Semiconductors GmbH (DE)

( * ) Notice: Subject to any disclaimer, the term of this patent is extended or adjusted under 35 U.S.C. 154(b) by 38 days.

(21) Appl. No.: 13/123,410

(22) PCT Filed: Oct. 19, 2009

(86) PCT No.: PCT/DE2009/001449
§ 371 (c)(1),
(2), (4) Date: May 17, 2011

(87) PCT Pub. No.: WO2010/051790
PCT Pub. Date: May 14, 2010

(65) Prior Publication Data
US 2011/0215295 A1    Sep. 8, 2011

(30) Foreign Application Priority Data
Nov. 6, 2008    (DE) .................... 10 2008 056 175

(51) Int. Cl.
*H01L 21/00*    (2006.01)
(52) U.S. Cl.
USPC ............. 438/98; 438/93; 438/97; 438/308; 257/E21.006; 257/E21.077; 257/E21.053; 257/E21.085; 257/E21.097; 257/E21.133; 257/E21.134; 257/E21.229; 257/E21.352

(58) Field of Classification Search ............ 438/20, 438/21, 31, 32, 48, 55, 57, 79, 96, 64, 65, 438/69, 311, 602, 603, 604, 663, 682, 149, 438/745, 98, 91, 93, 97; 257/E21.006, E21.028, 257/E21.053, E21.077, E21.085, E21.121, 257/E21.126, E21.127, E21.134, E21.229, 257/E21.32, E21.347, E21.352, 200, 201
See application file for complete search history.

(56) References Cited

U.S. PATENT DOCUMENTS
6,184,144 B1 * 2/2001 Lo .................................. 438/703
(Continued)

FOREIGN PATENT DOCUMENTS
DE          100 56 645         9/2001
DE      10 2004 038 573        3/2006
(Continued)

OTHER PUBLICATIONS

Kikuchi, A. et al., "InGaN/GaN Multiple Quantum Disk Nanocolumn Light-Emitting Diodes Grown on (111) Si Substrate," *Journal of Applied Physics*, vol. 43, No. 12A, Jan. 12, 2004, pp. L1524-L1526.
Liu, X. et al., "Growth mechanism and properties of ZnO nanorods synthesized by plasma-enhanced chemical vapor deposition," *Journal of Applied Physics*, vol. 95, No. 6, Mar. 15, 2004, pp. 3141-3147.

(Continued)

*Primary Examiner* — David Nhu
(74) *Attorney, Agent, or Firm* — DLA Piper LLP (US)

(57) ABSTRACT

A method of producing a radiation-emitting thin film component includes providing a substrate, growing nanorods on the substrate, growing a semiconductor layer sequence with at least one active layer epitaxially on the nanorods, applying a carrier to the semiconductor layer sequence, and detaching the semiconductor layer sequence and the carrier from the substrate by at least partial destruction of the nanorods.

15 Claims, 2 Drawing Sheets

U.S. PATENT DOCUMENTS

| | | |
|---|---|---|
| 6,596,377 B1 | 7/2003 | Hersee et al. |
| 8,022,432 B2 * | 9/2011 | Yi et al. .......................... 257/99 |
| 2004/0157358 A1 | 8/2004 | Hiramatsu et al. |
| 2005/0082546 A1 | 4/2005 | Lee et al. |
| 2006/0270074 A1 | 11/2006 | Kim |
| 2006/0273341 A1 | 12/2006 | Lee et al. |
| 2007/0093037 A1 | 4/2007 | Zhu et al. |

FOREIGN PATENT DOCUMENTS

| | | |
|---|---|---|
| EP | 0 497 350 | 8/1992 |
| EP | 1 422 748 | 5/2004 |
| EP | 1 796 180 | 6/2007 |
| GB | 2 445 807 | 7/2008 |
| WO | 2007/021069 | 2/2007 |

OTHER PUBLICATIONS

Nakamura, S., "GaN Growth Using GaN Buffer Layer," *Japanese Journal of Applied Physics*, vol. 30, No. 10A, Oct. 1991, pp. L1705-L1707.

Telford, M., "Making ZnO nanorods the cool way," *Materials Today*, Apr. 2005, pp. 13.

Stoddard, T., "Blue light technology remains BU's intellectual property," *B.U. Bridge*, www.bu.edu/bridge/archive/2002/12-13/bluelight.htm.

* cited by examiner

METHOD OF PRODUCING A RADIATION-EMITTING THIN FILM COMPONENT AND RADIATION-EMITTING THIN FILM COMPONENT

RELATED APPLICATIONS

This is a §371 of International Application No. PCT/DE2009/001449, with an international filing date of Oct. 19, 2009, which is based on German Patent Application No. 10 2008 056 175.4, filed Nov. 6, 2008, the subject matter of which is incorporated by reference.

TECHNICAL FIELD

This disclosure relates to a method of producing a radiation-emitting thin film component and a radiation-emitting thin film component.

BACKGROUND

Widespread industrial use is made of optoelectronic components such as for instance light-emitting or laser diodes, for instance in the lighting sector. Examples of the features which encourage the widespread use of such components are their high efficiency and resistance to external stresses and environmental influences. Optoelectronic components also have a long service life, which results for instance in reduced maintenance costs for a light source comprising such a component. The service life which may be achieved for an optoelectronic component is also determined to a considerable extent by the process used for its production.

It could therefore be helpful to provide a method of producing a radiation-emitting thin film component with a long service life. It could also be helpful to provide a radiation-emitting thin film component with a long service life.

SUMMARY

We provide a method of producing a radiation-emitting thin film component including providing a substrate, growing nanorods on the substrate, growing a semiconductor layer sequence with at least one active layer epitaxially on the nanorods, applying a carrier to the semiconductor layer sequence, and detaching the semiconductor layer sequence and the carrier from the substrate by at least partial destruction of the nanorods.

We also provide a radiation-emitting thin film component including a carrier, a semiconductor layer sequence applied on the carrier, which semiconductor layer sequence has at least one active layer that emits electromagnetic radiation, and a light outcoupling structure formed of nanorods and located on a side of the semiconductor layer sequence remote from the carrier, wherein the nanorods are conical or pyramidal in shape and a continuous layer is formed by the nanorods on a major side of the semiconductor layer sequence.

DETAILED DESCRIPTION

Figure 1:
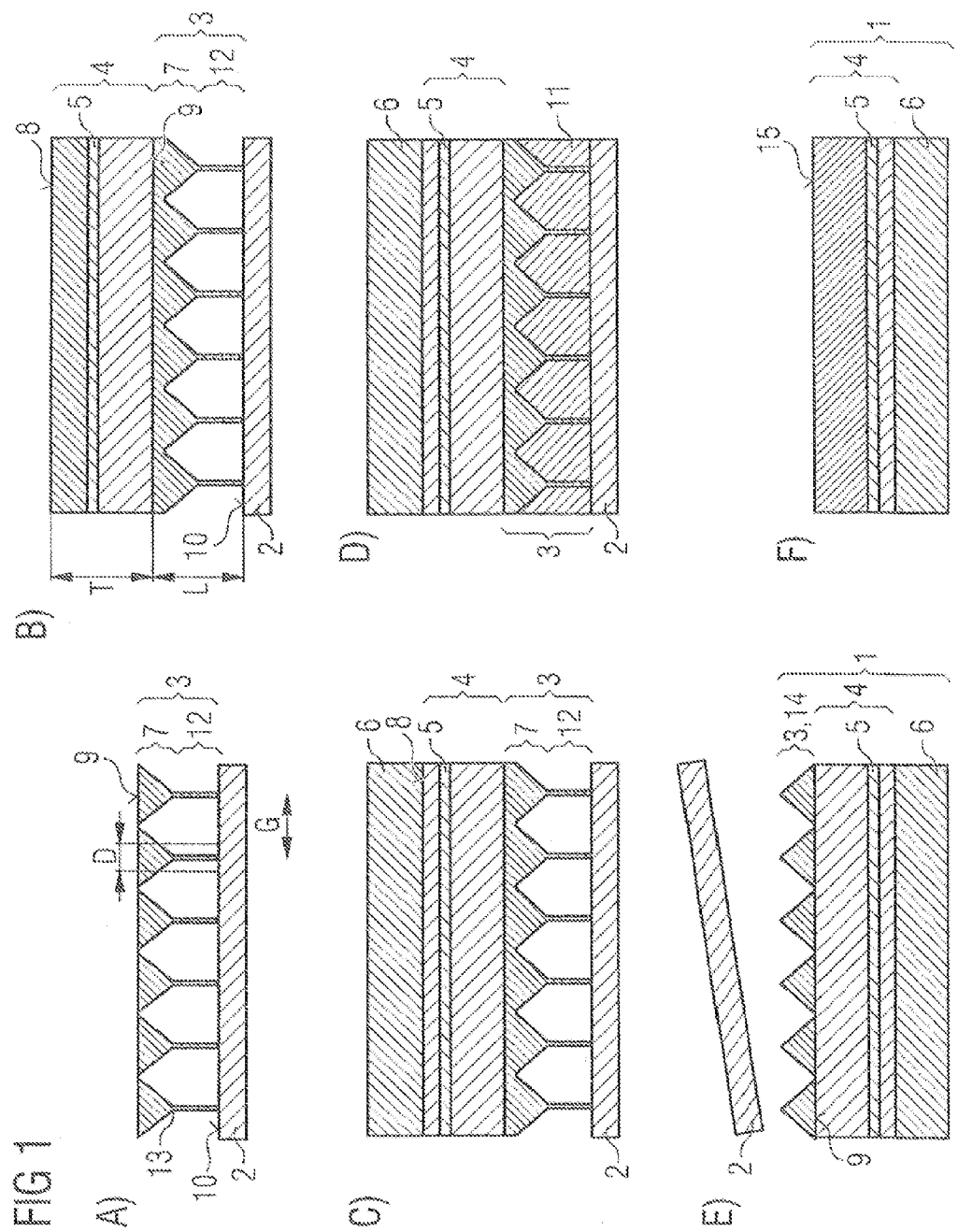
FIGS. 1 A) to 1 F) are schematic representations of various method steps for producing a thin film component described herein.

We provide a method including the step of providing a substrate. The substrate preferably comprises a flat substrate top. The substrate is made of silicon or sapphire, for example. The diameter of the substrate amounts preferably to at least 10 cm, in particular at least 20 cm. The substrate may take the form of a "wafer".

The method may include the step of growing nanorods on the substrate. Nanorods are rod- or column-like structures with a diameter in the nanometer range. The diameter is in particular in the range of values between 10 nm and 500 nm, preferably between 30 nm and 150 nm. The height or length of the nanorods, in a direction perpendicular to the substrate top, amounts to from a few 100 nm to a few micrometers. The nanorods may have a uniform diameter over their entire length or also have regions of smaller or larger diameter. The nanorods may for example have a round, hexagonal or polygonal outline. The nanorods grow on the substrate preferably in such a manner that over wide areas, i.e. over at least 75% of the area of the substrate top, or over the entire substrate top, the nanorods are present in a uniform density and uniform configuration after growth. The nanorods are preferably in direct contact with the substrate and are grown directly on the substrate top.

The method may include the step of applying a semiconductor layer sequence. The semiconductor layer sequence comprises at least one active layer, which is designed to emit electromagnetic radiation when the thin film component is in operation. The semiconductor layer sequence is preferably based on gallium-nitride and/or gallium-phosphide and/or gallium-arsenide. "Based" means that essential material components are gallium and nitrogen, phosphorus or arsenic. In particular, the semiconductor layer sequence may also comprise further materials, such as aluminium and indium. The semiconductor layer sequence may comprise a plurality of layers, which may differ in material composition and/or doping.

Application of the semiconductor layer sequence may involve epitaxial growth. The semiconductor layer sequence may be grown for example by molecular beam epitaxy or gas phase epitaxy.

Growth of the semiconductor layer sequence may proceed on the nanorods, that is to say the semiconductor layer sequence is grown on that side of the nanorods which is remote from the substrate. The semiconductor layer sequence is preferably in direct contact with the nanorods.

The method may comprise the step of applying a carrier to a major side of the semiconductor layer sequence remote from the substrate. The carrier may be attached to the semiconductor layer sequence for example by bonding. The carrier is not for example grown on the semiconductor layer sequence but rather is manufactured separately and then applied to the semiconductor layer sequence and joined firmly thereto mechanically. The carrier comprises a sufficiently high level of mechanical stability to bear the semiconductor layer sequence and protect it from damage for example due to bending.

The method may comprise the step of detaching the semiconductor layer sequence and the carrier joined thereto from the substrate. In other words, the semiconductor layer sequence attached to the carrier is separated from the substrate together with the carrier.

Detachment from the substrate may be effected by at least partial destruction of the nanorods. By destroying the nanorods, the mechanical connection between semiconductor layer sequence and carrier on the one hand and the substrate on the other hand is undone. Destruction of the nanorods may be based on a chemical and/or thermal and/or mechanical process.

The method of producing a radiation-emitting thin film component may comprise the following steps:
providing a substrate,
growing nanorods on the substrate,
growing a semiconductor layer sequence with at least one active layer epitaxially on the nanorods,
applying a carrier to the semiconductor layer sequence, and
detaching semiconductor layer sequence and carrier from the substrate by at least partial destruction of the nanorods.

Such a production method is able to reduce mechanical strain and cracks in the semiconductor layer sequence, which result from growth. This increases the service life of a component produced by such a method.

One option for producing or growing optoelectronic components consists of epitaxial methods. From the gas phase, for example, a semiconductor layer sequence is deposited on a substrate or grown on the substrate. For growth it is necessary for the lattice structures of the substrate and the material to be grown to match one another, in particular for the lattice constants not to differ too greatly from one another. If this is not the case, mechanical strain arises in the grown material of the semiconductor layer sequence. In particular, this strain may lead for example to cracking in the semiconductor layer sequence, which may prevent use of the semiconductor layer sequence for an optoelectronic component or reduce the service life of such a component markedly.

In addition, during epitaxy comparatively high temperatures of from several 100 degrees Celsius to over 1000 degrees Celsius occur. As a result of these elevated temperatures and the temperature differences in particular associated therewith, caused for example by cooling of substrate and semiconductor layer sequence after epitaxial growth of the semiconductor layer sequence, significant thermal strain may arise, which may lead to destruction or destabilisation of the semiconductor layer sequence on cooling. Thus, semiconductor layer sequence and substrate should preferably be adapted to one another with regard to the lattice structure of the materials and the coefficients of thermal expansion.

Semiconductor chips emitting in the green, blue or ultraviolet spectral ranges are based in particular on GaN and/or AlInGaN. For such semiconductor materials it is difficult to get hold of growth substrates comprising a suitable lattice structure and suitable coefficients of thermal expansion in sufficient numbers and of sufficient quality and size. This on the one hand raises the costs of such semiconductor chips. On the other hand, as described, the service life of a semiconductor chip grown on such a substrate may be reduced due to potential thermal strain and cracking.

One possible way of ensuring mutual adaptation of the coefficients of thermal expansion to the lattice structure of substrate and semiconductor layer sequence is to use extensive buffer layers. Such methods are described in DE 100 56 645 A1 and in DE 10 2004 038 573 A1. The article by Nakamura, *Japanese Journal of Applied Physics*, Vol. 30, No. 10A, October 1991, pages L1705 to L1707 also discloses such a method. Since those publications describe continuous layers, thermal strain and/or lattice mismatches occur which, though reduced, are still marked. In this way component yield may be reduced and the service life of the components shortened.

The following recognition, among other things, underlies a method described herein: compared with their diameter, nanorods have a long length. In addition, nanorods applied to a substrate cover only a relatively small proportion of the area, so meaning that the nanorods form a mechanically comparatively flexibly configured layer of column-like construction. Since the nanorods in particular are not densely packed, the nanorods may bend and thus compensate thermal strain due to lattice mismatch even over relatively large areas. To grow a semiconductor layer sequence in particular epitaxially on the nanorods, the nanorods preferably exhibit a widened or enlarged diameter on a side remote from the substrate such that a continuous surface results, for example. The growth of nanorods on a substrate is described in the articles by Kikuchi et al., *Japanese Journal of Applied Physics*, Vol. 43, No. 12A, 2004, pages L1524 to L1526, and "Making ZnO nanorods the cool way", *Materials Today*, April 2005, page 13, and Liu et al., *Journal of Applied Physics*, Vol. 95, No. 6, pages 3141 to 3147. The subject matter of these articles regarding the growth of nanorods is hereby incorporated herein by reference.

The step of growing the nanorods may comprise forming nuclei on the substrate. The nanorods then continue to grow, starting from the nuclei, in a direction perpendicular to the substrate top. Formation of the nuclei may proceed in a self-organizing manner, that is to say the materials of substrate and nanorods have different lattice constants. This lattice mismatch results in islands of the material of the nanorods on the substrate top, which form the nuclei. Alternatively or in addition, the nuclei may be produced wet-chemically. A further option involves forming nuclei using a photolithographic process with the assistance of a mask or using a nanoimprint method. The nuclei may furthermore be formed by heating a metallic layer, for example comprising gold. Heating the metallic layer leads to the formation of islands. The formation of nuclei allows efficient nanorod growth.

The at least partial destruction of the nanorods may be effected on detachment of the semiconductor layer sequence from the substrate by a process which includes wet-chemical etching. An etching liquid is for example passed through the spaces between the nanorods. This etching liquid at least partially dissolves the nanorods. In this way the mechanical connection between substrate and semiconductor layer sequence is undone, such that semiconductor layer sequence and carrier may be separated from one another efficiently and without mechanical stress to the semiconductor layer sequence.

The nanorods may comprise top parts located at regions of the nanorods remote from the substrate and are conical or pyramidal in shape. In addition, at a bottom part facing the substrate the nanorods are for example cylindrical or prism-like in shape. A pointed structure of the conical or pyramidal top parts in this case points towards the substrate and forms an area of transition between top and bottom parts. The top parts of the nanorods thus taper towards the substrate. In other words the nanorods are funnel-shaped, and a funnel point is directed towards the substrate. Nanorods configured in this way allow efficient growth of the semiconductor layer sequence and at the same time provide a highly shock-absorbing effect for the nanorods relative to strain of thermal and/or structural origin occurring during growth of the semiconductor layer sequence.

The nanorods may be grown without an active zone, that is to say the nanorods do not comprise any region which is designed to emit, receive or convert electromagnetic radiation. In this sense, the nanorods do not form a functional element of the radiation-emitting thin film component produced using such a method. If the nanorods lack an active zone, growth of the nanorods on the substrate is straightforward. This allows large-area growth of the nanorods on the substrate.

The nanorods may be arranged in a regular lattice, that is to say the predominant proportion of the nanorods, in particular more than 80 percent, is located at lattice points of the lattice. The lattice is for instance hexagonal, square or rhombic. If the nanorods are arranged in a regular lattice, the nanorods form a high quality growth surface for the semiconductor layer sequence.

The average lattice spacing of the lattice may amount to at most 1000 nm, preferably at most 400 nm. The average lattice spacing is thus in particular less than one wavelength of the electromagnetic radiation to be emitted by the active layer when the thin film component is in operation. In this way, the optical characteristics of the thin film component may be purposefully influenced.

The average diameter of the nanorods may amount to at most half a wavelength, preferably at most a quarter of a wavelength of the highest frequency radiation emitted by the active layer in operation. The average diameter of the nanorods should be understood to mean the diameter averaged over the entire length of the nanorods. If the nanorods comprise for example a cylindrical bottom part and a conical top part, the diameter needs to be averaged over the top and bottom parts. If the at least one active layer of the semiconductor layer sequence emits radiation for example in the blue spectral range, and the lowest wavelength emitted by the active layer is 430 nm, the average diameter is less than 215 nm, preferably less than 107 nm. Preferably at least half, in particular at least 75% of the nanorods are configured with such an average diameter, within the bounds of manufacturing tolerances. Such nanorods make it possible for the optical characteristics of the thin film component to be purposefully adjusted.

The length of the nanorods in a direction perpendicular to the substrate top may amount to at least 500 nm. Such a nanorod length ensures that the nanorods have sufficiently high flexibility to be able to compensate strain of mechanical and/or structural origin resulting from a lattice mismatch between substrate and semiconductor layer sequence.

Semiconductor layer sequence and nanorods may be made of different materials.

For example, the nanorods are based on or consist of ZnO and/or GaN, and the semiconductor layer sequence consists of or is based on InGaN, InAlGaN and/or AlGaN. In other words, the Al content and/or the In content of the nanorods may be lower by at least a factor of 10 than in the semiconductor layer sequence.

Nanorods and substrate may be made of different materials. This increases the configuration options for the thin film component. In addition, the structure of the nanorods may be purposefully adjusted, depending on specific requirements.

Nanorods and semiconductor layer sequence may be made on the basis of the same material system. In particular, both nanorods and semiconductor layer sequence are based on GaN, AlGaN, InGaN or AlInGaN such that thin film components may be produced which exhibit emission in the blue spectral range. Such nanorods ensure that, on growth of the semiconductor layer sequence on the nanorods, particularly low mechanical strain arises as the result of a lattice mismatch.

The top parts of the nanorods may remain at least in part on the semiconductor layer sequence when the semiconductor layer sequence is detached from the substrate. In this way, a light-outcoupling structure may be provided on the semiconductor layer sequence by the conical or pyramidal top parts.

The top parts of the nanorods, which for example remain on the semiconductor layer sequence on detachment, may be subsequently removed. This may be brought about by polishing. In this way, thin film components may be produced which may be efficiently mounted on a further, external carrier.

The nanorods may be made of an amorphous or polycrystalline material, that is to say the nanorods do not consist of a monocrystal. This widens the design options for the nanorods with regard to material selection and process parameters for growth of the nanorods. The electrical characteristics of the nanorods, such as their conductivity, may also be influenced in this way.

At least one photonic crystal may be formed by the nanorods. A photonic crystal is understood to mean a periodic structure which is suitable for influencing by diffraction and/or interference the optical characteristics of the radiation emitted by the thin film component. For example, the nanorods or the top parts of the nanorods may remain on the semiconductor layer sequence. An interference filter may then for instance be produced by the lattice spacing of the nanorods such that radiation of a predetermined wavelength may subsequently leave the thin film component for example only in specific angle ranges. By configuring the nanorods as a photonic crystal the options for use of the thin film component are increased.

The semiconductor layer sequence may be grown with a thickness of at most 100 μm, in particular of at most 50 μm, preferably of at most 20 μm. In this manner, thin film components may be produced which are particularly thin.

The thin film component produced in this way may have a thickness of at most 500 μm, preferably of at most 170 μm, particularly preferably of at most 75 μm, in particular of at most 40 μm. Alternatively or in addition, the quotient of an average lateral extent and a thickness of the thin film component is greater than or equal to 5, preferably greater than or equal to 10, in particular greater than or equal to 20.

The in particular epitaxially grown semiconductor layer sequence of the thin film component produced by the method may have a thickness of at most 20 μm, preferably of at most 8 μm.

The nanorods may form a continuous layer on a side of the top parts remote from the substrate. This simplifies growth of the semiconductor layer sequence on the nanorods.

The length of the top parts of the nanorods, in a direction perpendicular to the substrate top, may be less than the length of the bottom parts of the nanorods. The bottom parts may exhibit a length which is smaller than a quarter of the length of the top parts. Likewise, the nanorods may comprise exclusively conical or pyramidal top parts. Such a configuration of the nanorods reduces the time needed for growth of the nanorods.

The nanorods may have a length in the range between 500 nm and 1.5 μm. In this way, the nanorods exhibit sufficient flexibility and at the same time sufficient strength to allow their use as a growth base for the semiconductor layer sequence.

The substrate may not be damaged on detachment of semiconductor layer sequence and carrier, that is to say detachment is non-destructive for the substrate. This makes it possible for the substrate to be used repeatedly for growth of a semiconductor layer sequence. This reduces the costs of the method.

The nanorods may be based on ZnO or GaN. Such nanorods are efficient to produce and the configuration of the nanorods may be purposefully adjusted over a wide range by the process parameters during growth.

The substrate may be made of silicon and the nanorods are applied in a self-organising manner. The nanorods and the semiconductor layer sequence are based on gallium-nitride and the nanorods have a length in the range between 500 nm and 1.5 µm and a diameter in the range between 30 nm and 150 nm. The nanorods are without an active zone. Detachment of the semiconductor layer sequence from the substrate proceeds wet-chemically and the substrate is not damaged thereby. Thin film components produced by such a method have a long service life.

In the method in which the substrate is made of sapphire or silicon, the nanorods may be made of ZnO or GaN and grown using a self-organising process. It is likewise possible for the nanorods to be applied using a photolithographic method step. The semiconductor layer sequence has a thickness of at most 100 µm, preferably of at most 20 µm and is based on gallium-nitride. The top parts of the nanorods are grown to be conical or pyramidal in shape, wherein the top parts have a pointed structure, wherein this pointed structure points towards the substrate. Furthermore, after detachment of the semiconductor layer sequence from the substrate at least a part of the top parts of the nanorods remains on the semiconductor layer sequence. In this way a light outcoupling structure is formed. A thin film component produced using such a method exhibits a high level of light outcoupling efficiency.

The steps involving growth of nanorods and semiconductor layer sequences, application of the carrier and detachment from the substrate may take place in the wafer composite. Separation into individual thin film components does not proceed, for example, until the detachment from the substrate. Such a method simplifies handling of the semiconductor layer sequence and the carrier. In this way, the mechanical stresses to which the semiconductor layer sequence is subject in the course of production are diminished.

The disclosure further relates to a radiation-emitting thin film component. For example, the thin film component may be produced by one or more of the above-stated examples of a method. Features of the method are therefore also disclosed for the thin film component and vice versa.

In at least one example of the radiation-emitting thin-film component, the component comprises a carrier. Furthermore, the thin film component comprises a semiconductor layer sequence with at least one active layer, which is designed to emit electromagnetic radiation when the thin film component is in operation. The semiconductor layer sequence is applied to the carrier. In addition, the thin film component comprises a light outcoupling structure, which is formed of nanorods and is located on a major side of the semiconductor layer sequence remote from the carrier. The carrier is not in this case a growth substrate for the semiconductor layer sequence, but rather is applied to the semiconductor layer sequence after growth thereof. Furthermore, the nanorods forming the light outcoupling structure are conical or pyramidal in shape, wherein pointed structures of the nanorods point away from the semiconductor layer sequence, and a continuous layer is formed by the nanorods on a major side of the semiconductor layer sequence remote from the carrier.

The component may take the form of a light-emitting diode. The thin film component may thereby be used in many different ways.

Some of the fields of application in which a thin film component described herein may be used are for instance the backlighting of displays or display means. Furthermore, a thin film component described herein may for instance be used in lighting devices for projection purposes, in floodlights or spotlights or for general lighting.

A method described herein and a thin film component described herein will be explained in greater detail below with reference to the drawings and with the aid of examples. Elements which are the same in the individual figures are indicated with the same reference numerals. The relationships between the elements are not shown to scale, however, but rather individual elements may be shown exaggeratedly large to assist in understanding.

FIG. 1 shows an example of a method of producing a thin film component 1.

FIG. 1A shows nanorods 3 grown on a substrate top 10 of a substrate 2. The substrate 2 is a silicon wafer. The substrate 2 is covered extensively by the nanorods 3. The nanorods 3 each comprise a bottom part 12 and a top part 7. The bottom part 12 is cylindrical and/or column-shaped. The top part 7 comprises a pointed structure 13, which forms the transition between bottom part 12 and top part 7. The pointed structure 13 points towards substrate 2. The top parts 7 are conical or pyramidal. A continuous layer 9 of the nanorod 3 material is formed on a side of the top parts 7 remote from the substrate 2. The nanorods 3 are grown on the substrate 2 by way of a self-organising process.

An average lattice spacing G between the nanorods amounts to around 300 nm. An average diameter D amounts to around 100 nm. The average diameter D relates to a total length L of the nanorods 3 in a direction perpendicular to the substrate top 10. For the average diameter D the bottom parts 12 and the top parts 7 must thus be taken into account. The length L of the nanorods 3 amounts to around 1 µm.

Application of a semiconductor layer sequence 4 to the continuous layer 9 is shown in FIG. 1B. The semiconductor layer sequence 4 is grown epitaxially onto the continuous layer 9. The semiconductor layer sequence 4 comprises an active layer 5, which is configured to emit electromagnetic radiation when the thin film component 1 is in operation. The semiconductor layer sequence 4 is based, like the nanorods 3, on GaN. The semiconductor layer sequence 4 comprises a major side 8 remote from the substrate 2. A thickness T of the semiconductor layer sequence 4 amounts to around 12 µm.

In a subsequent method step, see FIG. 1C, a carrier 6 is applied to the major side 8 of the semiconductor layer sequence 4. The carrier 6 is attached to the semiconductor layer sequence 4 for example by bonding. As an alternative the carrier 6 may be adhered to the semiconductor layer sequence 4 or soldered thereto, for instance by an Au:Sn alloy, not shown, applied to the semiconductor layer sequence 4 and the carrier 6. It is optionally possible for an interlayer, not shown, to be applied between the carrier 6 and the semiconductor layer sequence 4, which interlayer is for example reflective.

The carrier 6 may consist of the same material as the substrate 2. The carrier 6 is preferably electrically conductive. For example, the carrier 6 comprises silicon, germanium or a metal. It is likewise possible for the carrier 6 to comprise a ceramic such as $Al_2O_3$, wherein electrically conductive structures may be applied to the ceramic.

FIG. 1D shows that semiconductor layer sequence 4 and carrier 6 are separated from the substrate 2 using a wet-chemical process. A liquid etchant 11 is used between substrate 2 and semiconductor layer sequence 4 in the region of the nanorods 3. The etchant 11 partially erodes the material from which the nanorods 3 are made. In this way, in particular the bottom parts 12 of the nanorods 3 are detached or destroyed. By this destruction of the bottom parts 12 the semiconductor layer sequence 4 joined to the carrier 6 is detached from the substrate 2. This is visible in FIG. 1E. This means that no laser lift-off process is necessary for detachment.

It is optionally possible, see FIG. 1F, for example by polishing, to wear away the top parts 7 of the nanorods 3 remaining on the semiconductor layer sequence 4. This results in a thin film component 1, for example in the form of a light-emitting diode, with a planar light passage face 15, remote from the carrier 6, of the semiconductor layer sequence 4.

An example of a preferred form of the thin film component 1 is shown in FIG. 1E. The top parts 7 of the nanorods 3 form a light outcoupling structure 14. The periodicity of the light outcoupling structure 14 corresponds to the lattice spacing G of the nanorods 3, see FIG. 1A. The lattice spacing G is less than one wavelength of the radiation produced by the active layer 5 when the thin film component 1 is in operation. The continuous layer 9 remains on the side of the semiconductor layer sequence 4 remote from the carrier 6.

The light outcoupling structure 14 is thus produced on detachment of semiconductor layer sequence 4 and carrier 6 from the substrate 2. A further possible way of achieving roughening for improved light outcoupling consists in a mechanical process. However, in this way only irregular structures may be achieved, the precise dimensions of which are difficult to control. In particular, the slope angles of such roughening may vary greatly and thus impair light outcoupling efficiency. Roughening produced by wet-chemical etching which makes use of roughnesses resulting from crystal defects or faults in the crystal surface of the semiconductor layer sequence 4 is also reproducible only to a limited degree. In addition, a considerable amount of material, more than the depth of the roughening, is eroded by wet-chemical roughening of the semiconductor layer sequence 4, to achieve roughening sufficient for a high level of light outcoupling. In this way, relatively high layer thicknesses of the semiconductor layer sequence 4 need to be produced, which may result in increased cracking and thus reduced service life or component yield. In the method described herein, in contrast only a small amount of material, which is substantially formed by the bottom parts 12 of the nanorods 3, has to be removed wet-chemically. The top parts 7 of the nanorods 3 remain largely unaffected by the etchant 11 as far as their structure is concerned.

It is also possible to increase light outcoupling by using photolithographic processes to achieve roughening. However, the entire area is not accessible in this way, since regions covered with photoresist cannot be roughened. With such a process, regions thus remain on the light passage face 15 which are oriented parallel to the major side 9 of the semiconductor layer sequence 4. In such regions light outcoupling efficiency is reduced. This may be circumvented by a method described herein, it being possible to provide the entire face of the semiconductor layer sequence 4 remote from the carrier 6 with the light outcoupling structure 14.

Figure 2:
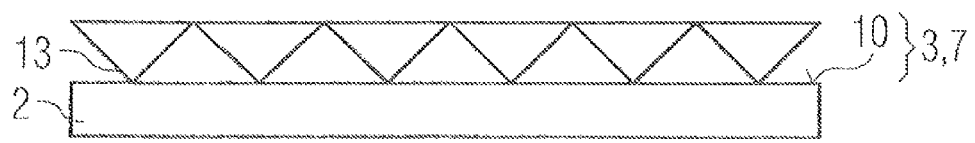
FIG. 2 is a schematic representation of an example of nanorods described herein.

FIG. 2 shows a further possible configuration of the nanorods 3. The bottom part 12 of the nanorods 3 is no longer present in this figure. The top parts 7 thus sit with their pointed structure 13 on the substrate 2 and alone form the nanorods 3. The nanorods 3 are made of ZnO or GaN.

Figure 3:
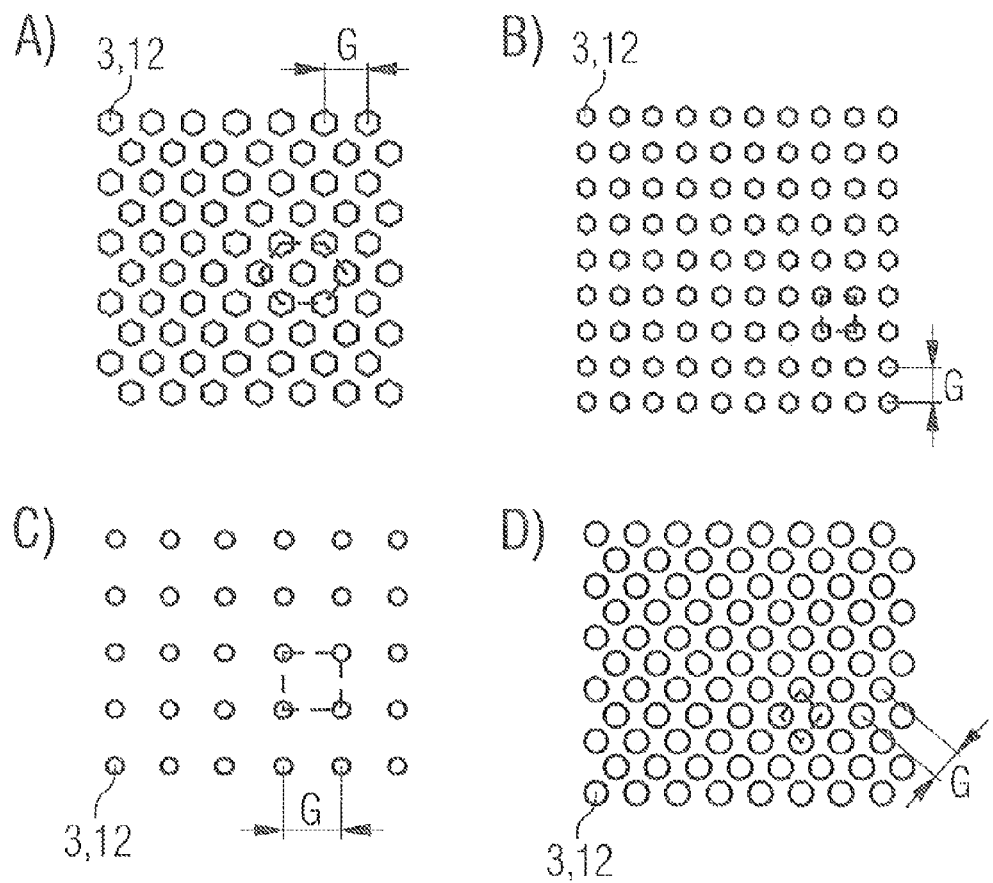
FIGS. 3 A) to 3 D) show schematic plan views of examples of nanorods described herein.

FIG. 3 is a schematic plan view of the nanorods 3. For reasons of diagrammatic representation a section is shown through the nanorods in the region of the bottom parts 12, such that the top parts 7 do not conceal the bottom parts 12. The plan views shown may be produced for example in the example according to FIG. 1.

According to FIG. 3A the nanorods 3 have a hexagonal outline. The nanorods 3 are additionally arranged in a hexagonal lattice, symbolized by a broken line, which comprises an average lattice spacing G of around 300 nm.

According to FIGS. 3B and 3C, the nanorods 3 have a square lattice structure, symbolized by broken lines. According to FIG. 3C the bottom parts 12 of the nanorods 3 cover only a relatively small proportion of the substrate top 10. As a result of this, the average lattice spacing G is greater in FIG. 3C than in FIG. 3B.

In the example according to FIG. 3D the nanorods 3, as also according to FIG. 3C, have a circular outline. The nanorods 3 are arranged in a rhombic lattice.

Parts of the bottom parts 12 may optionally remain on the semiconductor layer sequence 4 or on the top parts 7 on detachment of the semiconductor layer sequence 4 from the substrate 2. The average lattice spacing G is here preferably less than the shortest wavelength of the radiation produced by the at least one active layer 5 when the thin film component 1 is in operation. In this way, a photonic crystal may be formed by the top parts 7 and/or by bottom parts 12 remaining on the semiconductor layer sequence 4, which photonic crystal transmits radiation of specific wavelengths only in specific directions for example by interference or diffraction.

The nanorods 3 may be applied to the substrate top 10 by a self-organizing process, by lithographic methods or using a nanoimprint method. The nanorods 3 are preferably applied in ordered manner.

The methods and components described herein are not restricted by the description given with reference to the examples. Rather, the methods and components encompass any novel feature and any novel combination of features, including in particular any combination of features in the appended claims, even if this feature or this combination is not itself explicitly indicated in the claims or examples.

The invention claimed is:

1. A method of producing a radiation-emitting thin film component comprising:
   providing a substrate;
   growing nanorods on the substrate;
   growing a semiconductor layer sequence with at least one active layer epitaxially on the nanorods;
   applying a carrier to the semiconductor layer sequence; and
   detaching the semiconductor layer sequence and the carrier from the substrate by at least partial destruction of the nanorods.

2. The method of producing a radiation-emitting thin film component according to claim 1, wherein a wet-chemical etching process causes the at least partial destruction of the nanorods.

3. The method of producing a radiation-emitting thin film component according to claim 1, wherein top parts of the nanorods remote from the substrate are conical or pyramidal in shape.

4. The method of producing a radiation-emitting thin film component according to claim 1, wherein the nanorods are grown without an active zone.

5. The method of producing a radiation-emitting thin film component according to claim 1, wherein the nanorods are arranged in a regular lattice and an average lattice spacing of the lattice is at most 1000 nm.

6. The method of producing a radiation-emitting thin film component according to claim 1, wherein an average diameter of the nanorods is at most half a wavelength of a highest frequency radiation emitted by the at least one active layer.

7. The method of producing a radiation-emitting thin film component according to claim 1, wherein a length of the nanorods in a direction perpendicular to a substrate top of the substrate is at least 500 nm.

8. The method of producing a radiation-emitting thin film component according to claim 1, wherein the nanorods and the semiconductor layer sequence are made of different materials.

9. The method of producing a radiation-emitting thin film component according to claim 3, wherein, on detachment from the substrate, the top parts of the nanorods remain at least partially on the semiconductor layer sequence.

10. The method of producing a radiation-emitting thin film component according to claim 1, wherein the nanorods are made of an amorphous or polycrystalline material.

11. The method of producing a radiation-emitting thin film component according to claim 1, wherein a photonic crystal is formed with the nanorods.

12. The method of producing a radiation-emitting thin film component according to claim 3, wherein the nanorods form a continuous layer on a side of the top parts remote from the substrate.

13. The method of producing a radiation-emitting thin film component according to claim 1, wherein:
the substrate is made of silicon;
the nanorods are applied in a self-organized manner;
the nanorods and the semiconductor layer sequence are based on GaN;
the nanorods have a length between 500 nm and 1.5 μm and a diameter between 30 nm and 150 nm;
the nanorods are without an active zone;
detachment from the substrate proceeds wet-chemically; and
the substrate is not damaged by the detachment.

14. The method of producing a radiation-emitting thin film component according to claim 1, wherein:
the substrate is made of sapphire or silicon;
the nanorods are made of ZnO or GaN;
the nanorods are applied in a self-organizing manner or with a photolithographic step;
the semiconductor layer sequence is grown with a thickness of at most 100 μm and is based on GaN;
top parts of the nanorods are grown to be conical or pyramidal in shape, and wherein a pointed structure of the top parts points towards the substrate; and
the nanorods remain in part on the semiconductor layer sequence after detachment from the substrate and form a light outcoupling structure.

15. A radiation-emitting thin film component comprising:
a carrier;
a semiconductor layer sequence applied on the carrier, which semiconductor layer sequence has at least one active layer that emits electromagnetic radiation; and
a light outcoupling structure formed of nanorods and located on a side of the semiconductor layer sequence remote from the carrier;
wherein the nanorods are conical or pyramidal in shape and a continuous layer is formed by the nanorods on a major side of the semiconductor layer sequence.

* * * * *